United States Patent
Takatsuka

(10) Patent No.: US 6,803,638 B2
(45) Date of Patent: Oct. 12, 2004

(54) SEMICONDUCTOR HALL SENSOR

(75) Inventor: Toshinori Takatsuka, Fuji (JP)

(73) Assignee: Asahi Kasei Electronics Co., Ltd., Tokyo (JP)

( * ) Notice: Subject to any disclaimer, the term of this patent is extended or adjusted under 35 U.S.C. 154(b) by 0 days.

(21) Appl. No.: 10/472,959

(22) PCT Filed: Jul. 25, 2002

(86) PCT No.: PCT/JP02/07541
§ 371 (c)(1),
(2), (4) Date: Mar. 9, 2004

(87) PCT Pub. No.: WO03/010836
PCT Pub. Date: Feb. 6, 2003

(65) Prior Publication Data
US 2004/0129934 A1 Jul. 8, 2004

(30) Foreign Application Priority Data
Jul. 26, 2001 (JP) .................................... 2001-226657

(51) Int. Cl.$^7$ .......................... H01L 29/82; H01L 43/00
(52) U.S. Cl. ...................... 257/422; 257/424; 257/427
(58) Field of Search .............................. 257/421, 422, 257/424, 425, 427

(56) References Cited

U.S. PATENT DOCUMENTS

| 3,202,913 | A | | 8/1965 | Marinace |
| 4,204,132 | A | | 5/1980 | Kataoka et al. |
| 4,584,552 | A | | 4/1986 | Suzuki et al. |
| 5,065,204 | A | | 11/1991 | Tomisawa et al. |
| 5,075,247 | A | * | 12/1991 | Matthews ..................... 438/3 |
| 5,289,410 | A | * | 2/1994 | Katti et al. ................. 365/170 |

FOREIGN PATENT DOCUMENTS

| JP | 53-20782 | 2/1978 |
| JP | 53-20783 | 2/1978 |
| JP | 1-298354 | 12/1989 |
| JP | 2-187083 | 7/1990 |
| JP | 2002-43651 | 2/2002 |

* cited by examiner

Primary Examiner—Ngân V. Ngô
(74) Attorney, Agent, or Firm—Finnegan, Henderson, Farabow, Garrett & Dunner, LLP

(57) ABSTRACT

A semiconductor Hall sensor can reduce measuring error due to an unbalanced voltage by decreasing the unbalanced voltage, and improve resistance to electrostatic by suppressing maximum electric field in the sensor. A cross-shaped pattern of the semiconductor Hall sensor includes cutouts at its concave corners. Among the four concave corners of the cross-shaped pattern, consecutive two or four concave corners are provided with the cutouts. Besides, among the four concave corners of the cross-shaped patterns, the consecutive two or four concave corners have an acute angle at the intersection of the input terminal side pattern and output terminal side pattern. The semiconductor Hall sensor becomes insensitive to defects or unbalance of its pattern, thereby being able to reduce the unbalanced voltage as compared with a conventional cross-shaped pattern of the semiconductor Hall sensor.

11 Claims, 14 Drawing Sheets

SEMICONDUCTOR HALL SENSOR

TECHNICAL FIELD

The present invention relates to a semiconductor Hall sensor, and more particularly to pattern geometry of a semiconductor Hall sensor.

BACKGROUND ART

Conventionally, semiconductor Hall sensors are widely used as rotating position detecting sensors of drive motors for VTRs, floppies (registered trademark) and CD-ROMs, or as potentiometers and gear sensors. As their magneto-sensitive films, are used InSb (indium antimonide) with high mobility and sensitivity, and GaAs (gallium arsenide) with large energy bandgap width and good temperature characteristic.

The semiconductor Hall sensor is one of the magnetic sensors, which has a characteristic of producing a Hall output voltage proportional to magnetic flux density in the direction perpendicular to a magneto-sensitive plane. Accordingly, the Hall output voltage should be zero when no magnetic field is present. However, in actuality the semiconductor Hall sensor can sometimes generate the Hall output voltage when applied with an input voltage even without the magnetic field. The voltage is called an unbalanced voltage (Vu).

The unbalanced voltage, which constitutes DC noise superimposed on the Hall output voltage, causes measuring error of the semiconductor Hall sensor. In addition, there are some cases where Si integrated circuit must be used to correct the unbalanced voltage in order to zero the Hall output voltage when no magnetic field is present, which presents a problem of cost and size.

FIG. 11 is a cross-sectional view showing a structure of a conventional semiconductor Hall sensor using a semi-insulating GaAs substrate. On the top surface of a semi-insulating GaAs substrate 11, selective ion implantation of Si or the like is carried out, or a magneto-sensitive film 12 composed of InSb, InAs (indium arsenide) or GaAs is formed by MBE (molecular beam epitaxy) or MOVPE (metal organic vapor phase epitaxy). Then, it is processed to a desired pattern by photolithography. Subsequently, an inorganic protective film 14 composed of $SiO_2$ or SiN and internal electrodes 13 for passing a current are formed on the magneto-sensitive film 12, followed by dicing and die bonding. Then, wires 17 are connected to the electrodes 13, followed by molding with a resin 16. In FIG. 11, the reference numeral 15 designates a lead frame.

As described above, the magneto-sensitive pattern of the semiconductor Hall sensor is formed by patterning the magneto-sensitive film by the photolithography, followed by etching. The unbalanced voltage usually occurs because of geometric unbalance of a device geometry, which is produced during the patterning of the semiconductor Hall sensor. A leading cause thereof is that the pattern of the semiconductor Hall sensor drawn on the mask pattern is not in perfect agreement with the pattern of the actually fabricated semiconductor Hall sensor because of etching accuracy and the like.

To solve the problem, Japanese Patent Application Laid-open No. 1-298354, for example, discloses a method of chamfering four concave corners of a cross-shaped Hall device pattern (see, FIG. 8).

FIG. 2 is a diagram showing a pattern of a conventional semiconductor Hall sensor. At concave corners of a cross-shaped pattern 21, an input terminal side pattern forms a right angle of 90 degrees with an output terminal side pattern. The pattern of the semiconductor Hall sensor uses vertical electrodes as input side terminals, and horizontal electrodes as output side terminals.

Here, the length and width of the input terminal side pattern are denoted by L1 and W1, and the length and width of the output terminal side pattern are denoted by L2 and W2. More strictly, L1 and L2 are pattern distances of the semiconductor Hall sensor pattern across the electrodes, and W1 and W2 are defined as a greater one of the pattern width of the semiconductor Hall sensor and the pattern width of portions of the semiconductor Hall sensor contacting the electrodes.

Besides the chamfering, a method is known of reducing the unbalanced voltage by varying the ratio L/W of the length L and width W of the cross-shaped semiconductor Hall sensor pattern (in this example, it has a symmetric input/output pattern. Namely, L1=L2=L, W1=W2=W).

Generally, the unbalanced voltage generally reduces with an increase in L/W. However, an increasing L/W causes a new problem of increasing the size of the semiconductor Hall sensor. In addition, an increase in the L/W reduces the sensitivity (the output voltage under a specified magnetic flux density) of the semiconductor Hall sensor, which also presents a problem. In this method, since the rate of reduction of the unbalanced voltage is greater than that of the sensitivity, the signal-to-noise ratio is on the decrease, which means that the method is not suitable for a high accuracy measurement. Consequently, it is not a decisive method of reducing the unbalanced voltage.

Furthermore, the GaAs semiconductor Hall sensor or the like has a problem of a poor resistance to electrostatic as compared with the Si-composed integrated circuit (IC). The electric field takes a maximum value at concave corners of the pattern of the cross-shaped semiconductor Hall sensor. Thus, it is thought that the current concentrates to the concave corners, thereby causing a problem of destroying the device. The foregoing method disclosed in Japanese Patent Application Laid-open No. 1-298354 is effective for rather inaccurate etching like wet etching that is isotropic. However, dry etching with high anisotropy has been developed recently which utilizes ion milling or ECR (electron cyclotron resonance), thereby improving the etching accuracy. As a result, nearly ideal etching becomes possible, and hence the device with an almost identical geometry to the mask pattern can be formed. Therefore it is necessary to consider the pattern of the semiconductor Hall sensor capable of reducing the unbalanced voltage not empirically but theoretically.

The present invention is implemented in view of the foregoing problems. Therefore an object of the present invention is to provide a semiconductor Hall sensor capable of reducing the unbalanced voltage, and the measuring error resulting from the unbalanced voltage, and to improve the resistance to electrostatic.

DISCLOSURE OF THE INVENTION

The inventor of the present invention studied a pattern of the semiconductor Hall sensor that can reduce the unbalanced voltage through a simulation analysis and semiconductor Hall sensor prototypes. As a result of the simulation analysis, it was found theoretically that when the pattern of the semiconductor Hall sensor had defects or unbalance, the pattern of the semiconductor Hall sensor described in the foregoing Japanese Patent Application Laid-open No.

1-298354 with the chamfers increased the unbalanced voltage as compared with an ordinary cross-shaped Hall sensor pattern. The results will be described later in a comparative example 1.

Furthermore, the inventor of the present invention found patterns of the semiconductor Hall sensor, which were able to reduce the unbalanced voltage as compared with the conventional cross-shaped pattern or the pattern with the chamfers. In addition, inventor founds that the patterns of the semiconductor Hall sensor improved the resistance to electrostatic as well, thereby accomplishing the present invention.

To accomplish the objects of the present invention, according to a first aspect of the present invention, there is provided a semiconductor Hall sensor having a cross-shaped pattern that includes an input side pattern with a length and width of L1 and W1, and an output side pattern with a length and width of L2 and W2, the semiconductor Hall sensor being characterized in that: a film thickness, impurity concentration, the length L1 and width W1 of the input side pattern and the length L2 and width W2 of the output side pattern are maintained; and at least one of a resistance across input side terminals and a resistance across output side terminals is made 1.25 to 2.75 times a resistance of a cross-shaped pattern consisting of a rectangle with the length L1 and width W1 serving as the input side pattern, and a rectangle with the length L2 and width W2 serving as the output side pattern.

Thus placing the resistances of the input side pattern and output side pattern within the foregoing range can improve its characteristic by a few tens of percent as compared with the cross-shaped pattern without cutouts, when evaluated in terms of S/N, one of the most important characteristics of the Hall device.

In a range less than 1.25 times, the reduction effect of the unbalanced voltage is insufficient. In addition, when it is greater than 2.75 times, although the reduction in the unbalanced voltage is large, the S/N is deteriorated because of the reduction in signal component. As a result, the resistance is preferably in the range of 1.25 to 2.75 times.

According to a second aspect of the present invention, there is provided a semiconductor Hall sensor having a cross-shaped pattern that includes an input side pattern with a length and width of L1 and W1, and an output side pattern with a length and width of L2 and W2, the semiconductor Hall sensor comprising: at least one type of cutouts at consecutive two or four concave corners among four concave corners of a cross-shaped semiconductor Hall sensor, the cutouts having a geometry of one of a square, polygon, circle, ellipse and a combination of these forms, wherein the semiconductor Hall sensor is characterized in that: a film thickness, impurity concentration, the length L1 and width W1 of the input side pattern and the length L2 and width W2 of the output side pattern are maintained; and at least one of a resistance across input side terminals and a resistance across output side terminals is 1.25 to 2.75times a resistance of a cross-shaped pattern consisting of a rectangle with the length L1 and width W1 serving as the input side pattern, and a rectangle with the length L2 and width W2 serving as the output side pattern.

More preferably, both the resistance across the input side terminals and the resistance across the output side terminals may be 1.5 to 2.5 times the resistance of the cross-shaped pattern consisting of the rectangle with the length L1 and width W1 serving as the input side pattern, and the rectangle with the length L2 and width W2 serving as the output side pattern.

The foregoing range can improve the S/N of the Hall sensor by 30% or more. This makes it possible to suppress the characteristic variations to the same level achieved when a canceling circuit for suppressing the characteristic variations of the Hall IC is used, without using the canceling circuit of the unbalanced voltage. In addition, the resistance to electrostatic is improved markedly.

More preferably, the consecutive two or four concave corners of the four concave corners of the cross-shaped pattern may have an acute angle at an intersection of the input terminal side pattern and the output terminal side pattern of the cross-shaped pattern.

As a method of calculating the resistance of pattern geometry, anelectrostatic field analysis using a finite-element method is effective. The resistance can s be calculated by modeling the device geometry, analyzing the state that passes the constant current across the input or output terminals, calculating the voltage drop occurring at the time, and dividing the voltage drop by the amount of the current (Ohm's law).

BEST MODE FOR CARRYING OUT THE INVENTION

The embodiments in accordance with the invention will now be described with reference to the accompanying drawings.

Figure 1:
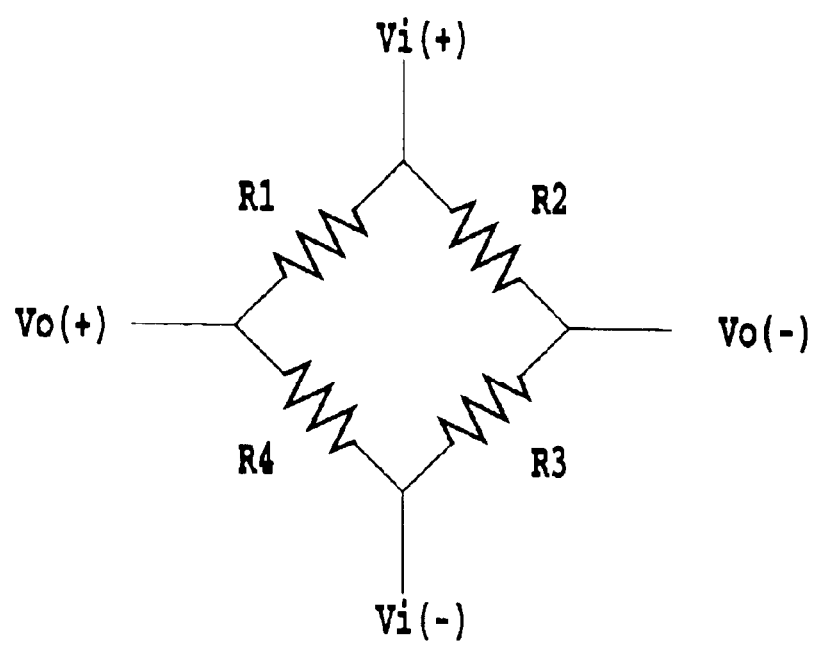
FIG. 1 is a diagram showing an equivalent bridge circuit of a semiconductor Hall sensor in accordance with the present invention.

FIG. 1 is a diagram showing an equivalent circuit of a semiconductor Hall sensor. The equivalent circuit can be represented by a bridge circuit using four resistors R1, R2, R3 and R4. In FIG. 1, when a voltage of one volt is applied across input terminals Vi(+) and Vi(−), the outputs at output side terminals Vo(+) and Vo(−) are given by the following expressions (1) and (2).

$$Vo(+) = R4/(R1+R4) \quad (1)$$

$$Vo(-) = R3/(R2+R3) \quad (2)$$

Since the Hall output voltage is expressed by the difference between expressions (1) and (2), the generated unbalanced voltage Vu is given by the following expression (3).

$$Vu = (R2 \cdot R4 - R1 \cdot R3)/(R1+R4) \cdot (R2+R3) \quad (3)$$

To reduce the unbalanced voltage, the value of expression (3) must be reduced. Ideally, if the four resistors R1, R2, R3 and R4 have the same value, then the unbalanced voltage Vu becomes zero. However, during the etching to form the pattern, a small number of defects and unbalance are produced in the pattern of the semiconductor Hall sensor, which results in a nonzero unbalanced voltage because the resistances become unequal. The variations in the resistors due to the unbalance remain within a certain limit because of the etching accuracy of forming the magneto-sensitive portion. Accordingly, to reduce the Vu, it is a choice to reduce the rate of change of each resistor for the same defects and unbalance.

To achieve this, the semiconductor Hall sensor in accordance with the present invention provides cutouts to two or four consecutive concave corners of the pattern in such a manner that the cutouts are placed inside the right angle positions of the concave corners of the cross-shaped pattern as described above. The cutouts can relief the concentration of the current to the concave corners thereby reducing the electric field in the concave corners. Accordingly, even if some geometric unbalance is present in the pattern of the semiconductor Hall sensor, it can prevent the variations in the electric field, thereby reducing the unbalanced voltage of the semiconductor Hall sensor. In other words, the cutouts formed at the concave corners, which reduce the electric field in the concave corners, can make the semiconductor Hall sensor insensitive to the geometric unbalance, and hence reduce the unbalanced voltage. In addition, the reduction in the electric field improves the resistance to electrostatic of the semiconductor Hall sensor.

Figure 11:
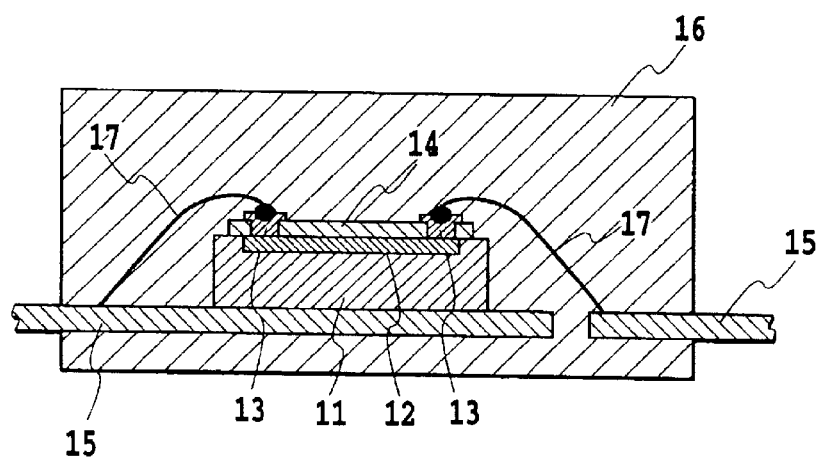
FIG. 11 is a cross-sectional view showing a structure of a conventional semiconductor Hall sensor.

The fabrication process of the semiconductor Hall sensor in accordance with the present invention is the same as the conventional method except for the pattern geometry of the magneto-sensitive portion of the Hall sensor. FIG. 11 shows one of such a semiconductor Hall sensor. Specifically, on the top surface of a semi-insulating GaAs substrate 11, selective ion implantation of Si or the like is carried out, or a magneto-sensitive film 12 composed of InSb, InAs (indium arsenide) or GaAs is formed by MBE or MOVPE. Then, it is processed to a desired pattern by photolithography. Subsequently, an inorganic protective film 14 composed of $SiO_2$ or SiN and internal electrodes 13 for passing a current are formed on the magneto-sensitive film 12, followed by dicing and die bonding. Then, wires 17 are connected to the electrodes 13, followed by molding with a resin 16.

EXAMPLE 1

Figure 2:
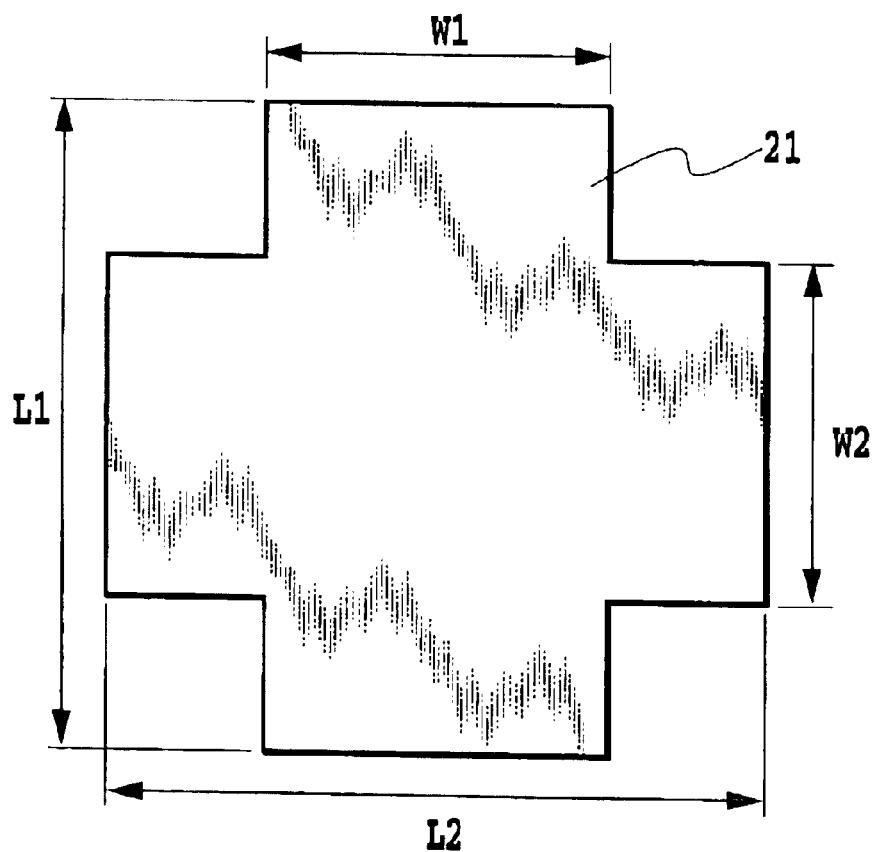
FIG. 2 is a diagram showing a pattern of a conventional cross-shaped semiconductor Hall sensor.
Figure 3:
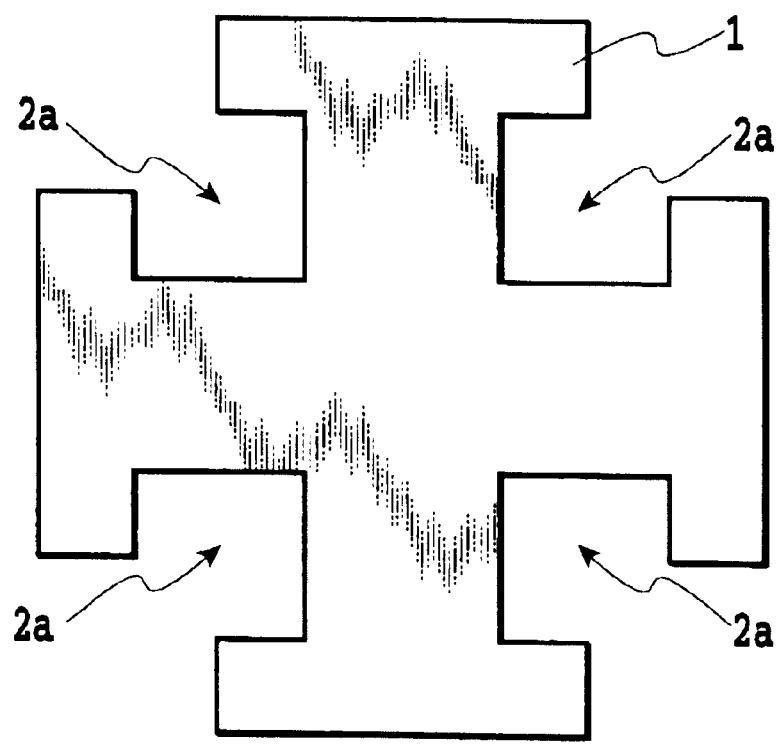
FIG. 3 is a diagram showing a pattern of a semiconductor Hall sensor in accordance with the present invention.

FIG. 3 is a diagram showing an example of the pattern of the semiconductor Hall sensor in accordance with the present invention. Since the pattern 1 of the semiconductor Hall sensor has a shape of a cross, it has four concave corners 2a. However, in contrast to the conventional pattern of the semiconductor Hall sensor as shown in FIG. 2, it has cutouts (removed portions) instead of the right angle concave corners. With the concave corners without the right angle, the pattern of the semiconductor Hall sensor in accordance with the present invention can reduce the electric field in the concave corners.

The cutouts are formed by cutting squares out of the concave corners. The squares each have a side of 35 μm for the cross-shaped pattern with the length L of 140 μm and a width W of 70 μm. The geometry of the cutouts is not limited to a square: It can take any form as long as it can be shaped by cutting such as a polygon other than a square, circle and ellipse. Unless the cutouts with the same geometry are formed in line symmetry with respect to either the input side pattern or output side pattern of the cross-shaped pattern, the unbalanced voltage can generate contrary to expectations FIGS. 4–7 are diagrams each showing an example of the geometry of the cutouts 2b, 2c, 2d and 2e.

The maximum electric field in the concave corners when ideal etching was performed and when the input voltage of one volt is applied are as follows. As for the conventional cross-shaped pattern of the semiconductor Hall sensor, it was $2.338 \times 10^4$ V/m. As for the pattern of the semiconductor Hall sensor with the square cutouts, it was $1.644 \times 10^4$ V/m, about a 30% reduction in the maximum electric field. In addition, it was confirmed that the pattern was effective to improve the resistance to electrostatic. As for the circular cutouts with a radius of 17.5 μm instead of the squares (FIG. 4), the maximum electric field was $1.216 \times 10^4$ V/m under the same conditions, which is about 48% reduction from that of the conventional cross-shaped pattern.

Figure 5:
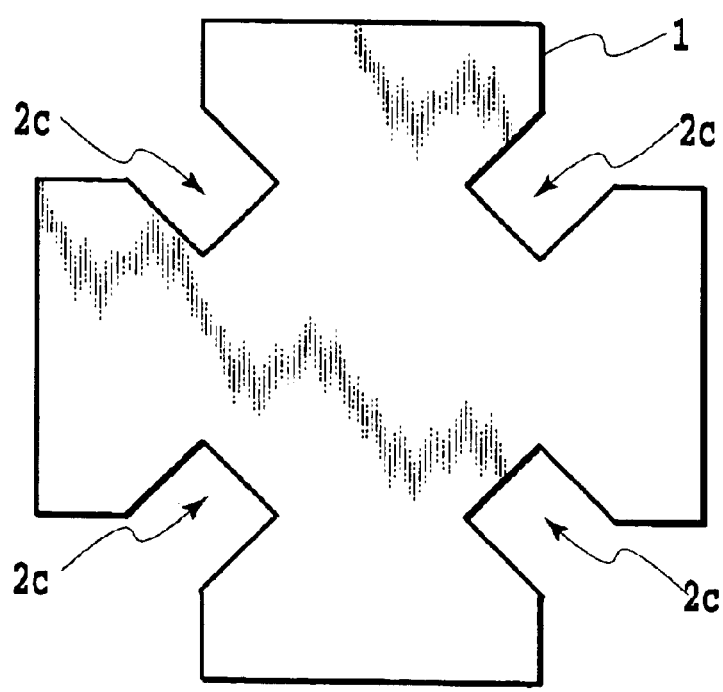
FIG. 5 is a diagram showing still another pattern of the semiconductor Hall sensor in accordance with the present invention.
Figure 6:
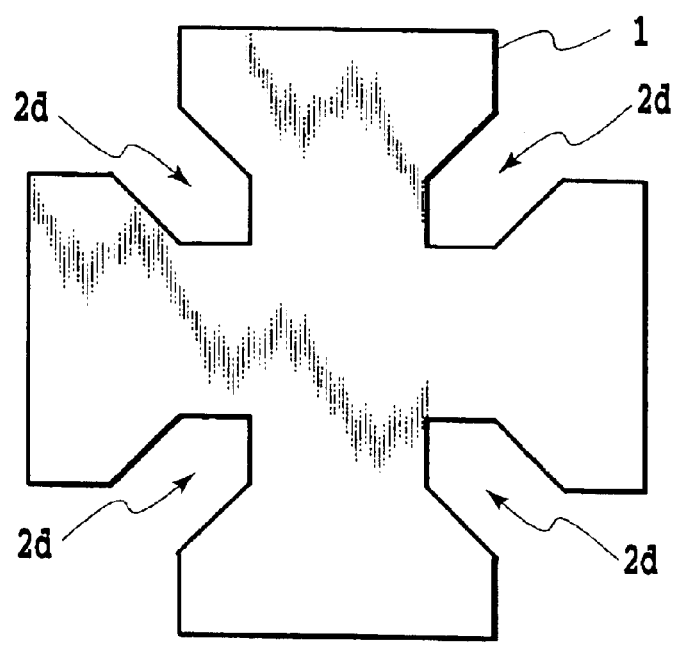
FIG. 6 is a diagram showing another pattern of the semiconductor Hall sensor in accordance with the present invention.
Figure 7:
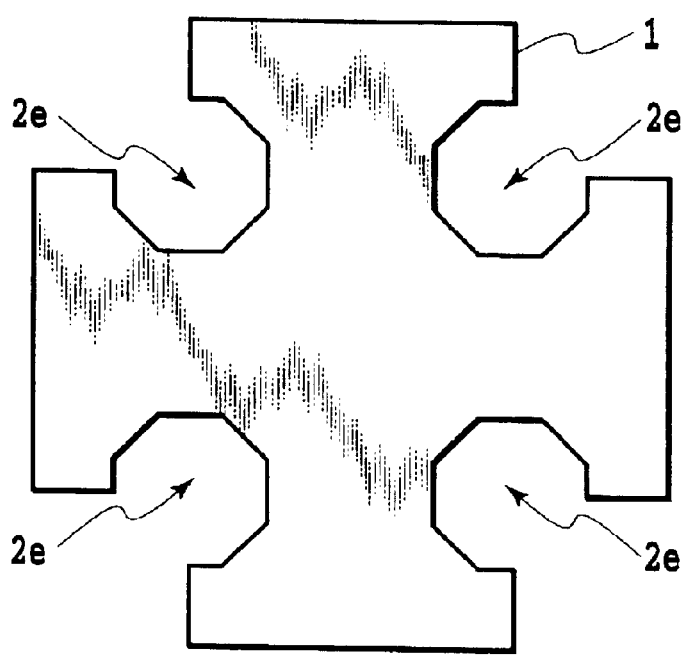
FIG. 7 is a diagram showing another pattern of the semiconductor Hall sensor in accordance with the present invention.

In summary, the foregoing results are shown in Table 1 along with the simulation results of FIGS. 5–7. Focusing attention on the improvement of the resistance to electrostatic, the geometry of the circular cutouts was best in the study performed this time.

TABLE 1

Figure 4:
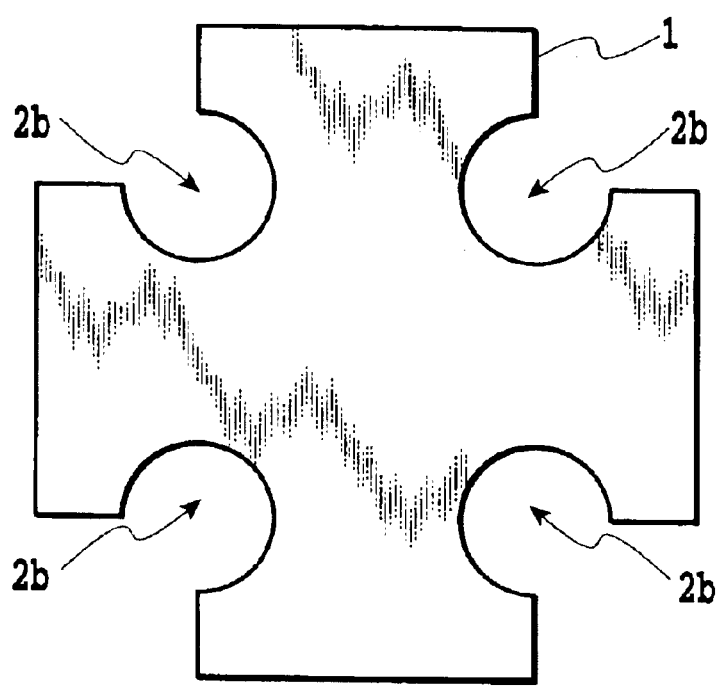
FIG. 4 is a diagram showing another pattern of the semiconductor Hall sensor in accordance with the present invention.

|  | maximum electric field (V/m) |
| --- | --- |
| FIG. 2 | 2.338 × 10⁴ |
| FIG. 3 | 1.644 × 10⁴ |
| FIG. 4 | 1.216 × 10⁴ |
| FIG. 5 | 2.221 × 10⁴ |
| FIG. 6 | 1.683 × 10⁴ |
| FIG. 7 | 1.396 × 10⁴ |

As for the dimensions of the cutouts, any dimensions are considered to be effective. In the simulation at this time, the ratios of the dimensions to (L−W) were set at 0.1–75%, and they were all effective to improve the resistance to electrostatic. Above all, the ratios of 25–75% were particularly effective. In terms of the variations in the input/output resistance, the effect was remarkable when the variations were 1.25–2.75 times. Although the simulation at this time employed the pattern of the Hall sensor that L/W was two, advantages similar to the foregoing results can be surely obtained for the ratios other than two.

However, the range of the dimensions of the cutouts for achieving the improvement of the resistance to electrostatic will vary a little with the variation in the value L/W. The foregoing simulation analysis was performed using an electric resistivity corresponding to InSb (indium antimonide) as a characteristic of the semiconductor Hall sensor. The similar effects were confirmed using the electric resistivity corresponding to InAs (indium arsenide) and GaAs (gallium arsenide).

EXAMPLE 2

Figure 9:
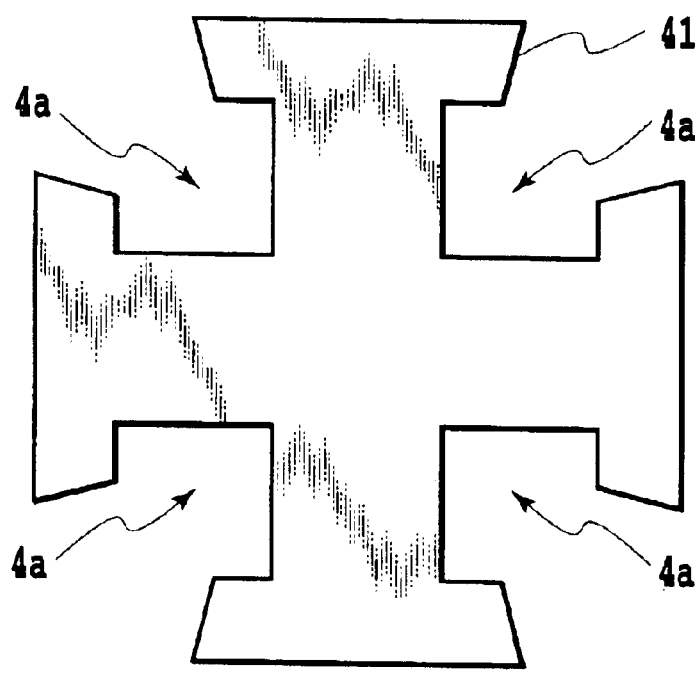
FIG. 9 is a diagram showing another pattern of the semiconductor Hall sensor in accordance with the present invention.
Figure 10:
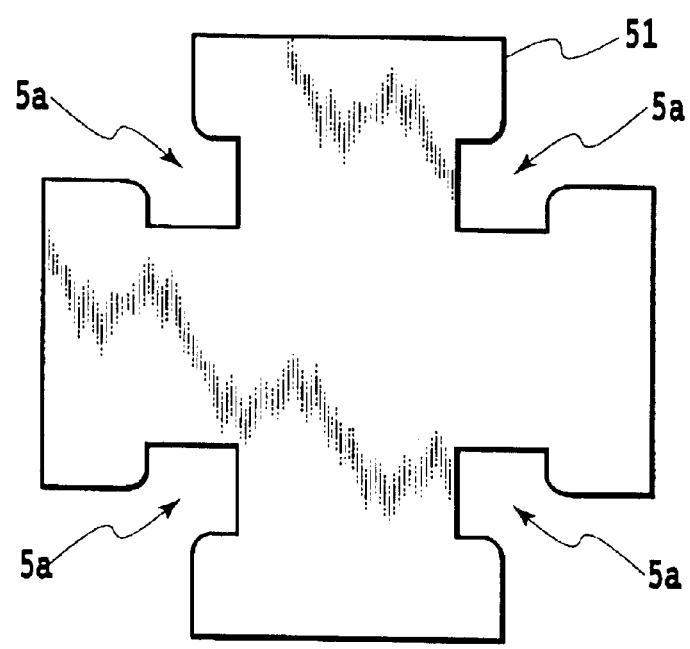
FIG. 10 is a diagram showing another pattern of the semiconductor Hall sensor in accordance with the present invention.

FIGS. 9 and 10 are diagrams showing another example of the pattern of the semiconductor Hall sensor in accordance with the present invention. As another pattern of the semiconductor Hall sensor for reducing the unbalanced voltage and improving the resistance to electrostatic other that the foregoing example 1, the example as shown in FIG. 9 or 10 is possible. It includes cutouts 4a or 5a in the concave corners of the cross-shaped pattern, the concave corners having an acute angle or rounded shape at intersection of the input/output pattern 41 or 51. The cutouts can offer similar advantages by forming them in the similar geometry and dimensions to those of the foregoing example 1.

EXAMPLE 3

A semiconductor Hall sensor was actually prototyped which included cutouts in the concave corners of a magneto-sensitive portion. The L and W of the pattern of the semiconductor Hall sensor were 140 μm and 70 μm, respectively. The geometry of the cutouts was four types of FIGS. 3, 5, 6 and 7. The dimensions of the cutouts are 5 μm–35 μm. In addition, the method of varying the ratio L/W as a conventional means for reducing the unbalanced voltage was carried out as a comparison. In this case, the semiconductor Hall sensor patterns were prototyped with the fixed width W of 70 μm, and with varying the length L in a range of 132–280 μm.

The results are as follows, in which the rate of change of the resistances, the rate of change of the standard deviation of the unbalanced voltage and the rate of change of the output voltage were computed with reference to those of the semiconductor Hall sensor pattern with L and W of 140 μm and 70 μm, and without the cutouts. As expected, 20 the average of the unbalanced voltage was about zero millivolt for all the prototype patterns this time. Thus evaluation of the reduction in the unbalanced voltage was made in terms of the standard deviation of the unbalanced voltage.

Figure 12:
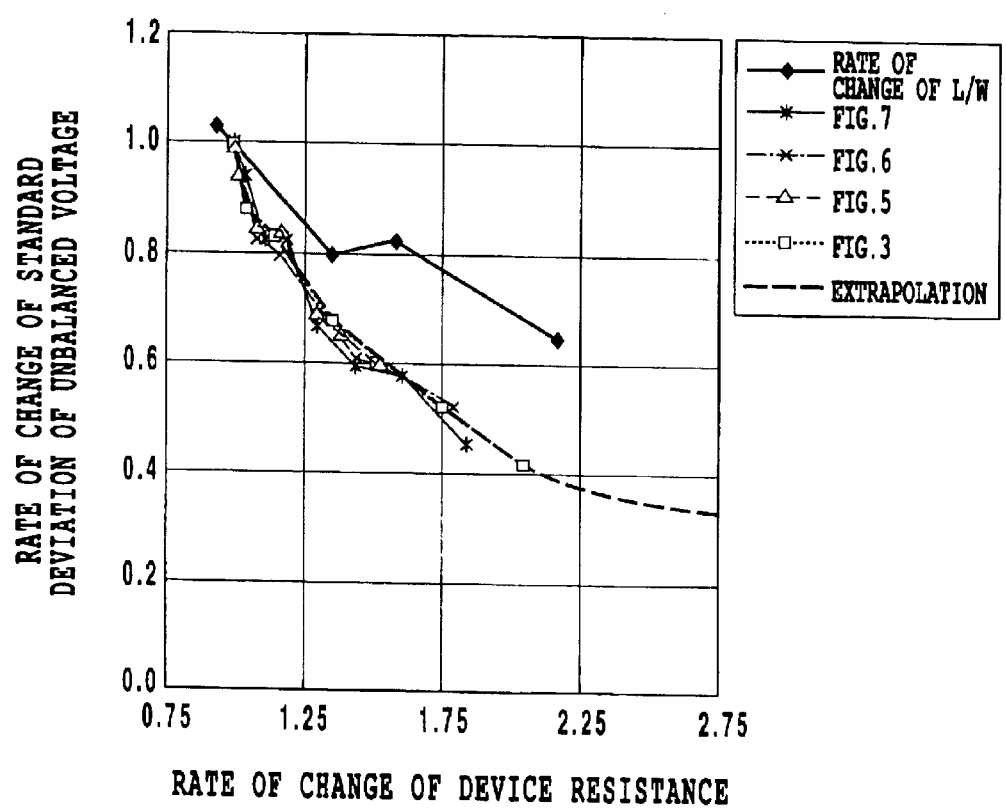
FIG. 12 is a graph illustrating the dependence of the rate of change of the standard deviation of the unbalanced voltage on the rate of change of the device resistance of the semiconductor Hall sensor in accordance with the present invention.

FIG. 12 is a graph whose vertical axis represents the rate of change of the standard deviation of the unbalanced voltage, and whose horizontal axis represents the rate of change of the resistance of the device. The rate of change of the standard deviation has little dependence on the geometry of the cutouts. However, it is clear that the rate of reduction in the standard deviation of the unbalanced voltage of each prototype is greater than that of the conventional method of varying L/W, for the same rate of change of the resistance.

Figure 13:
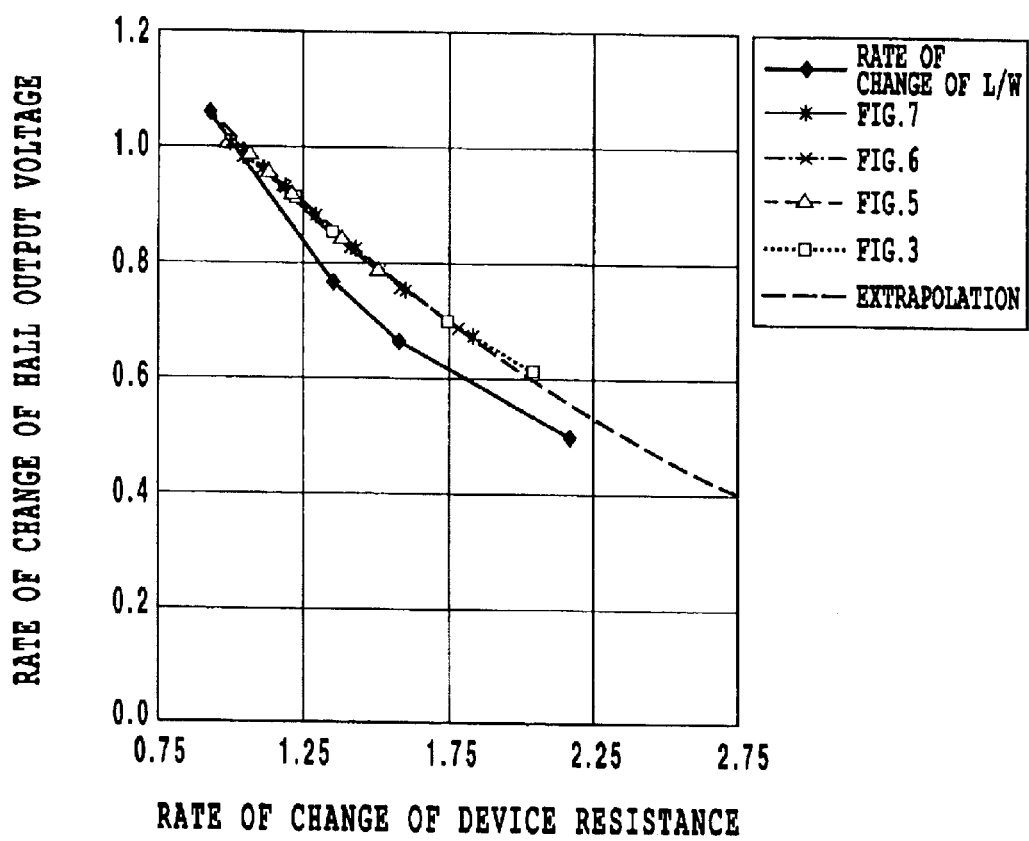
FIG. 13 is a graph illustrating the dependence of the rate of change of the Hall output voltage on the rate of change of the device resistance of the semiconductor Hall sensor in accordance with the present invention.

FIG. 13 is a graph whose vertical axis represents the rate of change of the Hall output voltage under a particular magnetic flux density, and whose horizontal axis represents the rate of change of the resistance of the device. Although these results have little dependence on the geometry of the cutouts in this case as well, it is seen that the rates of reduction in the output voltages are smaller than in the conventional method of varying the ratio L/W.

Figure 14:
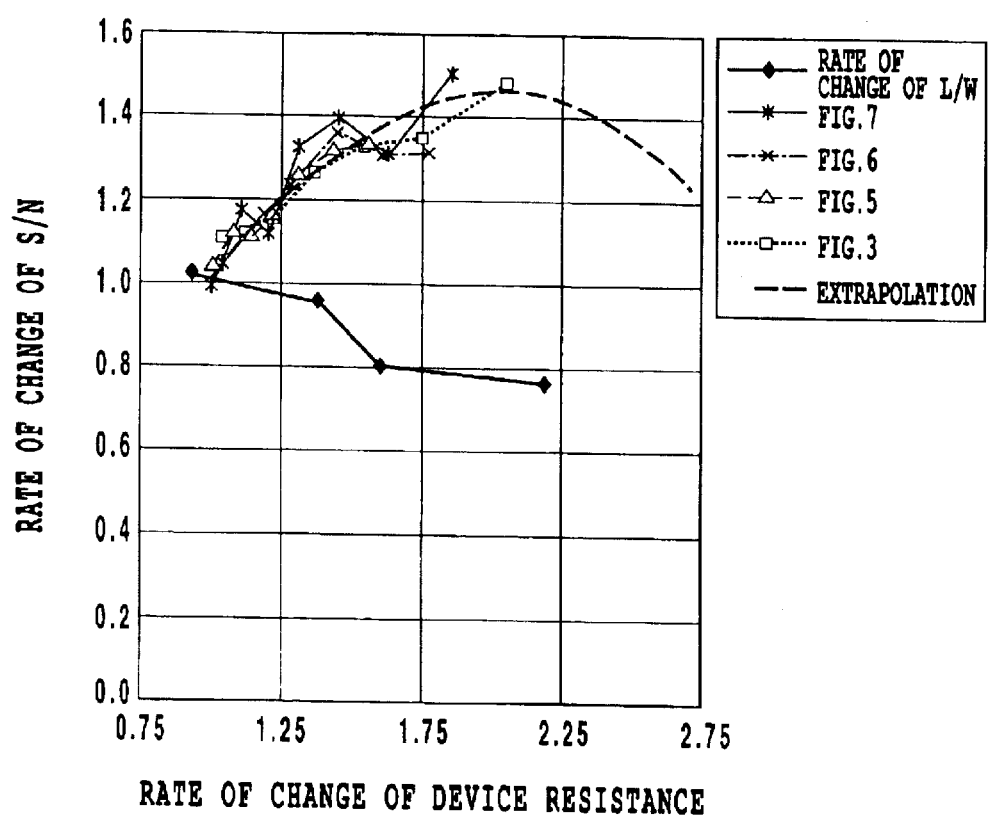
FIG. 14 is a graph illustrating the dependence of the S/N on the rate of change of the device resistance of the semiconductor Hall sensor in accordance with the present invention.

FIG. 14 is a graph whose vertical axis represents the quotient obtained by dividing the rate of change of the output voltage bythe rate of change of the standard deviation of the unbalanced voltage (rate of change of S/N) under a particular magnetic flux density, and whose horizontal axis represents the rate of change of the resistance of the device. Although these results have little dependence on the geometry of the cutouts in this case as well, it is seen that the examples with the rate of change of the device resistance of 1.25–2.75 can improve S/N by more than 20%, and of 1.5–2.5 have more conspicuous effect.

It is clear from the foregoing results that the semiconductor Hall sensors with the cutouts can improve the S/N ratio and enable the high accuracy measurement as compared with the conventional method of varying the ratio L/W. In addition, the present scheme offers an advantage of being able to improve the performance without increasing the size of the semiconductor Hall sensor.

When the pattern of the semiconductor Hall sensor geometry is given, the resistance can be calculated by using a finite-element analysis. The resistances of the lo prototypes of FIG. 3 and FIGS. 5–7 were obtained using the finite-element analysis. The ratios to the resistance of the reference pattern with L=140 μm and W =70 μm are shown in Table 2. The calculated results are found to be in good agreement with the experimental values.

TABLE 2

| | Ration to reference resistances (experimental values) | Ration to reference resistances (calculated values) |
| --- | --- | --- |
| FIG. 3 | 2.038 | 2.017 |
| FIG. 5 | 1.525 | 1.513 |
| FIG. 6 | 1.803 | 1.789 |
| FIG. 7 | 1.840 | 1.825 |

COMPARATIVE EXAMPLE

Figure 8:
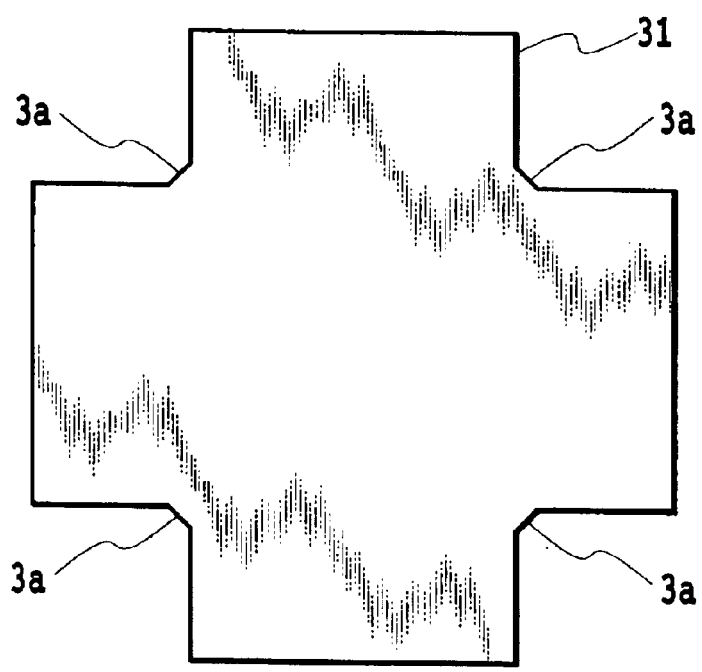
FIG. 8 is a diagram showing another pattern of the conventional cross-shaped semiconductor Hall sensor.

A study was also made of the unbalanced voltage generated by the conventional pattern of the semiconductor Hall sensor with the chamfers (FIG. 8) disclosed in the foregoing Japanese patent application laid-open No. 1-298354. A simulation analysis was carried out based on the cross-shaped pattern of the semiconductor Hall sensor as shown in FIG. 2. Specifically, the cross-shaped pattern with the length L of 140 μm and width W of 70 μm was used. The pattern had chamfers with the shape of an isosceles right triangle with two sides of 5.0 μm on the four concave corners of the cross-shaped pattern of the semiconductor lo Hall sensor. Consider cases where the two patterns each have a pattern defect with a shape of an isosceles right triangle with the two sides of 5.6 μm at a location 10 μm apart from the upper right concave corner toward the output terminal side. This assumes that parts of the patterns is of the semiconductor Hall sensors are removed because of over etching or the defect of the resist. The unbalances of the chamfered patterns brought about the unbalanced voltage of 3.25 mV for the input voltage of one volt.

Since the unbalanced voltage of the chamfered pattern of the conventional cross-shaped pattern of the semiconductor Hall sensor was 2.75 mV under the same condition, the unbalanced voltage increased by about 18%. The simulation analysis was conducted by using the electric resistivity corresponding to InSb (indium antimonide) as the characteristic of the semiconductor Hall sensor. Incidentally, using the electric resistivity corresponding to InAs (indium arsenide) and GaAs (gallium arsenide) brought about similar results.

INDUSTRIAL APPLICABILITY

As described above, according to the present invention, the consecutive two or four concave corners of the cross-shaped pattern have the cutouts, which make the semiconductor Hall sensor more insensitive to the defects or unbalance of its pattern. Thus, it can reduce the unbalanced voltage as compared with the conventional cross-shaped pattern of the semiconductor Hall sensor. In addition, it can reduce the maximum value of the electric field of the device in the concave corners of the pattern of the semiconductor Hall sensor. As a result, it can relief the current concentration, and hence can improve the resistance to electrostatic.

Furthermore, compared with the conventional method of reducing the unbalanced voltage, which varies the ratio L/W of the semiconductor Hall sensor pattern, the present method enables the semiconductor Hall sensor to shrink its size and to improve its S/N ratio. Therefore it can be safely said that a semiconductor Hall sensor suitable for high accuracy measurement.

What is claimed is:

1. A semiconductor Hall sensor having a cross-shaped pattern that includes an input side pattern with a length and width of L1 and W1 and a output side pattern with a length and width of L2 and W2, said semiconductor Hall sensor being characterized in that:

a film thickness, impurity concentration, the length L1 and width W1 of the input side pattern and length L2 and width W2 of the output side pattern are maintained; and at least one of a resistance across input side terminals and a resistance across output side terminals is made 1.25 to 2.75 times a resistance of a cross-shaped pattern consisting of a rectangle with the length L1 and width W1 serving as the input side pattern, and a rectangle with the length L2 and width W2 serving as the output side pattern.

2. The semiconductor Hall sensor as claimed in claim 1, wherein at least one type of cutouts at consecutive two or four concave corners among four concave corners of cross-shaped semiconductor Hall sensor, said cutouts having a geometry of one of a square, polygon, circle, ellipse and a combination of these forms.

3. The semiconductor Hall sensor as claimed in claim 2, wherein at least one of the resistance across the input side terminals and the resistance across the output side terminals is 1.5 to 2.5 times the resistance of the cross-shaped pattern consisting of the rectangle with the length L1 and width W1 serving as the input side pattern, and the rectangle with the length L2 and width W2 serving as the output side pattern.

4. The semiconductor Hall sensor as claimed in claim 2, wherein said consecutive two or four concave corners of the four concave corners of the cross-shaped pattern have an acute angle at an intersection of the input terminal side pattern and the output terminal side pattern of the cross-shaped pattern.

5. The semiconductor Hall sensor as claimed in claim 3, wherein both the resistance across the input side terminals and the resistance across the output side terminals are 1.5 to 2.5 times the resistance of the cross-shaped pattern consisting of the rectangle with the length L1 and width W1 serving as the input side pattern, and the rectangle with the length L2 and width W2 serving as the output side pattern.

6. The semiconductor Hall sensor as claimed in claim 3, wherein said consecutive two or four concave corners of the four concave corners of the cross-shaped pattern have an acute angle at an intersection of the input terminal side pattern and the output terminal side pattern of the cross-shaped pattern.

7. The semiconductor Hall sensor as claimed in claim 5, wherein said consecutive two or four concave corners of said four concave corners of the cross-shaped pattern have an acute angle at an intersection of the input terminal side pattern and the output terminal side pattern of the cross-shaped pattern.

8. The semiconductor Hall sensor as claimed in claim 1, wherein at least one of the resistance across the input side terminals and the resistance across the output side terminals is 1.5 to 2.5 times the resistance of the cross-shaped pattern consisting of the rectangle with the length L1 and width W1 serving as the Input side pattern, and the rectangle with the length L2 and width W2 serving as the output side pattern.

9. The semiconductor Hall sensor as claimed in claim 8, wherein both the resistance across the input side terminals and the resistance across the output side terminals are 1.5 to 2.5 times the resistance of the cross-shaped pattern consisting of the rectangle with the length L1 and width W1 serving as the input side pattern, and the rectangle with the length L2 and width W2 serving as the output side pattern.

10. The semiconductor Hall sensor as claimed in claim 8, wherein said consecutive two or four concave corners of the four concave corners of the cross-shaped pattern have an acute angle at an intersection of the input terminal side pattern and the output terminal side pattern of the cross-shaped pattern.

11. The semiconductor Hall sensor as claimed in claim 9, wherein said consecutive two or four concave corners of said four concave corners of the cross-shaped pattern have an acute angle at an intersection of the input terminal side pattern and the output terminal side pattern of the cross-shaped pattern.

* * * * *